(12) United States Patent
Otsubo

(10) Patent No.: US 11,171,067 B2
(45) Date of Patent: Nov. 9, 2021

(54) MODULE HAVING A SEALING RESIN LAYER WITH RADIATING MEMBER FILLED DEPRESSIONS

(71) Applicant: Murata Manufacturing Co., Ltd., Kyoto (JP)

(72) Inventor: Yoshihito Otsubo, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 135 days.

(21) Appl. No.: 16/565,847

(22) Filed: Sep. 10, 2019

(65) Prior Publication Data

US 2020/0006172 A1  Jan. 2, 2020

Related U.S. Application Data

(63) Continuation of application No. PCT/JP2018/008680, filed on Mar. 7, 2018.

(30) Foreign Application Priority Data

Mar. 13, 2017 (JP) .............................. JP2017-046962

(51) Int. Cl.
*H01L 23/28* (2006.01)
*H01L 23/36* (2006.01)
(Continued)

(52) U.S. Cl.
CPC .............. *H01L 23/28* (2013.01); *H01L 23/16* (2013.01); *H01L 23/36* (2013.01);
(Continued)

(58) Field of Classification Search
CPC ..... H01L 23/28; H01L 23/36; H01L 23/4334; H01L 24/32; H01L 24/48; H01L 25/04;
(Continued)

(56) References Cited

U.S. PATENT DOCUMENTS 5,233,225 A * 8/1993 Ishida .................... H01L 21/565
257/774
5,796,165 A * 8/1998 Yoshikawa ........... H01L 23/053
257/728
(Continued)

FOREIGN PATENT DOCUMENTS

JP        H01-139648 A    6/1989
JP        H03-171651 A    7/1991
(Continued)

OTHER PUBLICATIONS

International Search Report Issued in Patent Application No. PCT/JP2018/008680 dated May 22, 2018.
(Continued)

*Primary Examiner* — Ida M Soward
(74) *Attorney, Agent, or Firm* — Pearne & Gordon LLP

(57) ABSTRACT

A module with a high degree of design flexibility and excellent radiation characteristics is provided. The module includes a multilayer wiring substrate, mounting components mounted on an upper surface of the multilayer wiring substrate, a sealing resin layer sealing the mounting components, a plurality of depressions in an upper surface of the sealing resin layer, and radiators set in the depressions. The mounting components are components whose amounts of heat generated are smaller than those of the mounting components. A gap between a bottom of each of the depressions arranged in a region overlapping each of the mounting components and the mounting component is shorter than a gap between the bottom of each of the depressions arranged in a region overlapping each of the mounting components and the mounting component as seen from a direction perpendicular to the upper surface of the multilayer wiring substrate.

14 Claims, 6 Drawing Sheets

(51) Int. Cl.
*H01L 23/433* (2006.01)
*H01L 23/42* (2006.01)
*H01L 25/04* (2014.01)
*H01L 25/065* (2006.01)
*H01L 25/07* (2006.01)
*H01L 25/16* (2006.01)
*H01L 25/18* (2006.01)
*H01L 33/48* (2010.01)
*H01L 51/10* (2006.01)
*H01L 23/16* (2006.01)
*H01L 23/00* (2006.01)
*H05K 7/20* (2006.01)
*H01L 25/075* (2006.01)

(52) U.S. Cl.
CPC .......... *H01L 23/4334* (2013.01); *H01L 24/32* (2013.01); *H01L 24/48* (2013.01); *H01L 25/04* (2013.01); *H01L 25/18* (2013.01); *H05K 7/20* (2013.01); *H01L 23/42* (2013.01); *H01L 25/042* (2013.01); *H01L 25/0655* (2013.01); *H01L 25/072* (2013.01); *H01L 25/0753* (2013.01); *H01L 25/165* (2013.01); *H01L 33/483* (2013.01); *H01L 51/107* (2013.01); *H01L 2224/32225* (2013.01); *H01L 2224/48091* (2013.01); *H01L 2224/48227* (2013.01); *H01L 2924/1815* (2013.01)

(58) Field of Classification Search
CPC ....... H01L 25/18; H01L 23/42; H01L 25/042; H01L 25/0655; H01L 25/072; H01L 25/0753; H01L 25/165; H01L 33/483; H01L 51/107
See application file for complete search history.

(56) References Cited

U.S. PATENT DOCUMENTS

| | | | | |
|---|---|---|---|---|
| 6,703,707 B1 * | 3/2004 | Mamitsu | ............... | H01L 23/051 257/718 |
| 6,794,747 B2 * | 9/2004 | Takehara | ............ | H01L 23/3677 257/705 |
| 7,099,155 B2 * | 8/2006 | Kobayashi | .......... | B60R 16/0238 165/80.3 |
| 7,877,868 B2 * | 2/2011 | Tomikawa | ............. | H05K 3/284 29/841 |
| 7,993,978 B2 * | 8/2011 | Sato | ........................ | H01L 24/97 438/122 |
| 8,609,465 B2 * | 12/2013 | Kawahara | ............ | H01L 21/565 438/113 |
| 9,076,892 B2 * | 7/2015 | Sakai | .................. | H01L 23/3121 |
| 9,807,916 B2 * | 10/2017 | Kitazaki | ............. | H05K 9/0015 |
| 10,712,278 B2 * | 7/2020 | Santori | .................. | G01N 21/11 |
| 10,770,795 B2 * | 9/2020 | Wang | ....................... | H01Q 1/36 |
| 2008/0036644 A1 * | 2/2008 | Skultety-Betz | ......... | G01S 7/032 342/22 |
| 2008/0150096 A1 * | 6/2008 | Ishio | ................... | H01L 23/5389 257/659 |
| 2009/0001561 A1 | 1/2009 | Chua et al. | | |
| 2012/0098115 A1 | 4/2012 | Watanabe | | |
| 2015/0016066 A1 * | 1/2015 | Shimamura | .......... | H01L 21/561 361/728 |
| 2017/0271233 A1 * | 9/2017 | Imai | .................... | H01L 23/5389 |

FOREIGN PATENT DOCUMENTS

| | | | |
|---|---|---|---|
| JP | H11-26658 A | 1/1999 | |
| JP | 2008-130915 A | 6/2008 | |
| JP | 3143888 U | 8/2008 | |
| JP | 2010-514208 A | 4/2010 | |
| JP | 2012-028484 A | 2/2012 | |
| JP | 2012-094592 A | 5/2012 | |
| JP | 2014063844 A * | 4/2014 | ......... H01L 23/3107 |

OTHER PUBLICATIONS

Written Opinion issued in Patent Application No. PCT/JP2018/008680 dated May 22, 2018.

* cited by examiner

MODULE HAVING A SEALING RESIN LAYER WITH RADIATING MEMBER FILLED DEPRESSIONS

This is a continuation of International Application No. PCT/JP2018/008680 filed on Mar. 7, 2018 which claims priority from Japanese Patent Application No. 2017-046962 filed on Mar. 13, 2017. The contents of these applications are incorporated herein by reference in their entireties.

BACKGROUND

Technical Field

The present disclosure relates to a module including a radiating member.

Various modules are mounted on a mother substrate in electronic equipment, such as a communication terminal device. In some of such modules, various kinds of chip components may be mounted on a wiring substrate, and these chip components may be sealed with resin. Among the mounted chip components, for example, a semiconductor element, such as an integrated circuit, generates heat while the module is used. If the generated heat is stored in the module, its characteristics may degrade. To avoid this risk, modules capable of radiating heat generated from the mounted components have been proposed. One such example is a module described in Patent Document 1, and it is illustrated as a module 100 in FIG. 11. An IC 102 is placed on an upper surface 101a of a wiring substrate 101 and is connected to an electrode on the wiring substrate 101 by wire-bonding. A spacer 103 is set on an upper surface 102a of the IC 102, and these components are sealed with a sealing resin layer 104. The resin directly above the spacer 103 is removed by a laser or other tool, the spacer 103 is exposed through the removed section of an upper surface 104a of the sealing resin layer 104, and a radiating member 105 is set on the upper surface 104a, including the exposed section, of the sealing resin layer 104. With this configuration, heat generated from the IC 102 is transferred from the spacer 103 to the radiating member 105 and then radiated to the outside.

Patent Document 1: Japanese Unexamined Patent Application Publication (Translation of PCT Application) No. 2010-514208 (see paragraphs 0014 to 0021, FIG. 12, and the like)

BRIEF SUMMARY

In the known module 100, however, because the sealing resin layer 104 is perforated by being irradiated with laser light, the spacer 103 is needed to reduce the damage to the IC 102, and this leads to a low degree of design flexibility of the module 100.

The present disclosure provides a module with a high degree of design flexibility and excellent radiation characteristics.

A module of the present disclosure includes a wiring substrate, a first component, a second component, a sealing resin layer, at least two depressions, and two radiating members. The first component and the second component are mounted on a principal surface of the wiring substrate. The sealing resin layer has a contact surface in contact with the wiring substrate and an opposed surface opposed to the contact surface and seals the first component and the second component. The depressions are in the opposed surface of the sealing resin layer. Each of the radiating members is set in each of the depressions and includes at least one radiator element. The second component is a component whose amount of heat generated is smaller than that of the first component. The radiating members have a first region overlapping the first component and a second region overlapping the second component as seen from a direction perpendicular to the principal surface of the wiring substrate. The depressions reach neither the first component nor the second component. A distance from a bottom of the depression in the first region to the first component is shorter than a distance from the bottom of the depression in the second region to the second component.

In this configuration, because the radiating members are set in the depressions in the opposed surface of the sealing resin layer, unlike the known module, it is not necessary to arrange spacers for preventing damage to the components between the components and the radiating members at the time of forming the places for arranging the radiating members by laser processing, and the design flexibility of the module is improved. Because the distance from the first component, which is a heat generating component, to the radiating member is short, heat generated from the first component can be efficiently radiated by the radiating member.

Another module of the present disclosure includes a wiring substrate, a third component, a sealing resin layer, at least two depressions, and two radiating members. The third component is mounted on a principal surface of the wiring substrate. The sealing resin layer has a contact surface in contact with the wiring substrate and an opposed surface opposed to the contact surface and seals the third component. The depressions are in the opposed surface of the sealing resin layer. Each of the radiating members is set in each of the depressions and includes at least one radiator element. The third component has a first inner-component region and a second inner-component region whose amount of heat generated is larger than that of the first inner-component region as seen from a direction perpendicular to the principal surface of the wiring substrate. The radiating members have a region overlapping the first inner-component region and a region overlapping the second inner-component region as seen from the direction perpendicular to the principal surface of the wiring substrate. The depressions do not reach the third component. A distance from a bottom of the depression in the region overlapping the second inner-component region in the radiating member to the third component is shorter than a distance from the bottom of the depression in the region overlapping the first inner-component region in the radiating member to the third component.

In this configuration, because the radiating members are set in the depressions in the opposed surface of the sealing resin layer, unlike the known module, it is not necessary to arrange spacers for preventing damage to the components between the components and the radiating members at the time of forming the places for arranging the radiating members by laser processing, and the design flexibility of the module is improved. Because the distance to the radiating member is short in the second inner-component region, which is the heat generating region in the third component, heat generated from the second inner-component region can be efficiently radiated by the radiating member.

The module of the present disclosure may include a plurality of depressions. The module of the present disclosure may include a plurality of radiator elements. Each of the plurality of radiator elements set in each of the plurality of depressions may constitute radiating members. Some of the plurality of radiator elements may be arranged in a region that overlaps neither the first component nor the second component as seen from the direction perpendicular to the principal surface of the wiring substrate.

In this configuration, the module of the present disclosure includes a plurality of the radiator elements, and the radiator elements are arranged in both the region overlapping each of the first and second components and the region overlapping neither of them, as seen from the direction perpendicular to the principal surface of the wiring substrate. For example, if the radiating members are arranged in only the region overlapping the heat generating component (first component) as seen from the direction perpendicular to the principal surface of the wiring substrate, separation caused by the difference in the coefficient of linear expansion between the radiating members and the resin of the sealing resin layer may occur between the radiating members and the sealing resin layer. However, in the above-described configuration in which the radiating members include the plurality of radiator elements, because the contact area between the radiating members and the sealing resin layer is increased, the occurrence of separation between the radiator elements and the sealing resin layer caused by the difference in the coefficient of linear expansion between them can be prevented. In the arrangement in which the radiator elements are in both the region overlapping each of the first and second components and the region overlapping neither of them, the radiator elements are dispersed, and thus deformation of the sealing resin layer and separation of the sealing resin layer from the wiring substrate caused by the difference in the coefficient of linear expansion between the radiating members and the resin of the sealing resin layer can be suppressed.

The module of the present disclosure may include a plurality of depressions, the module of the present disclosure may include a plurality of radiator elements, the plurality of radiator elements set in each of the plurality of depressions may constitute the radiating member. Some of the plurality of radiator elements may be arranged in a region that does not overlap the third component as seen from the direction perpendicular to the principal surface of the wiring substrate.

In this configuration, the radiating member includes the plurality of radiator elements, and the radiator elements are arranged in both the region overlapping the third component and the region not overlapping it, as seen from the direction perpendicular to the principal surface of the wiring substrate. When the radiating member includes the plurality of radiator elements, because the contact area between the radiating member and the sealing resin layer is increased, the occurrence of separation between the radiator elements and the sealing resin layer caused by the difference in the coefficient of linear expansion between them can be prevented. In the arrangement in which the radiator elements are in both the region overlapping the third component and the region not overlapping it, the radiator elements are dispersed, and thus deformation of the sealing resin layer and separation of the sealing resin layer from the wiring substrate caused by the difference in the coefficient of linear expansion between the radiating member and the resin of the sealing resin layer can be suppressed. Moreover, separation between the radiator elements and the sealing resin can be suppressed.

Another module of the present disclosure includes a wiring substrate, a fourth component, a fifth component, a sealing resin layer, at least two depressions, and two radiating members. The fourth component and the fifth component are mounted on a principal surface of the wiring substrate. The sealing resin layer has a contact surface in contact with the wiring substrate and an opposed surface opposed to the contact surface and seals the fourth component and the fifth component. The depressions are in the opposed surface of the sealing resin layer. Each of the radiating members is set in each of the depressions and includes at least one radiator element. The fifth component is a component whose amount of heat generated is smaller than that of the fourth component. The depressions do not reach the fourth component. The radiating members have a region overlapping the fourth component and does not have a region overlapping the fifth component as seen from a direction perpendicular to the principal surface of the wiring substrate.

In this configuration, for example, if the fifth component is a component that easily changes its characteristics by thermal effects, because of the arrangement in which the radiating member is not in the region overlapping the fifth component, the thermal effects of thermal conduction from the radiating member on the fifth component can be eliminated, and thus the radiating structure can have a high degree of flexibility adjusted for the amounts of heat generated from the mounting components and the size of the module.

Another module of the present disclosure includes a wiring substrate, a sixth component, a sealing resin layer, at least two depressions, and two radiating members. The sixth component is mounted on a principal surface of the wiring substrate. The sealing resin layer has a contact surface in contact with the wiring substrate and an opposed surface opposed to the contact surface and seals the sixth component. The depressions are in the opposed surface of the sealing resin layer. Each of the radiating members is set in each of the depressions. The sixth component has a first inner-component region and a second inner-component region whose amount of heat generated is larger than that of the first inner-component region as seen from a direction perpendicular to the principal surface of the wiring substrate. The depressions do not reach the sixth component. The radiating members have a region overlapping the second inner-component region and does not have a region overlapping the first inner-component region as seen from a direction perpendicular to the principal surface of the wiring substrate.

In this configuration, because the thermal effects of thermal conduction from the radiating member on the first inner-component region can be eliminated, the radiating structure can have a high degree of flexibility adjusted for the amount of heat generated from the mounting component and the size of the module.

The plurality of radiator elements may be spaced uniformly as seen from the direction perpendicular to the principal surface of the wiring substrate.

In this configuration, because stresses occurring from the difference in the coefficient of linear expansion between the radiator elements and the resin of the sealing resin layer can be equalized inside the sealing resin layer, deformation of the sealing resin layer and separation of the sealing resin layer from the wiring substrate can be further suppressed.

The module may further include a shield film that covers the opposed surface of the sealing resin layer while being in contact with the radiating member.

In this configuration, because heat generated from the components can also be radiated through the shield film, the radiation characteristics of the module can be further improved.

According to the present disclosure, because the radiating member is set in the depression in the opposed surface of the sealing resin layer, unlike the known module, it is not necessary to arrange spacers for preventing damage to the components between the components and the radiating member at the time of forming the places for arranging the radiating member by laser processing, and the design flexibility of the module is improved. Because the distance to the radiating member is short in the second inner-component region, which is the heat generating region in the third component, heat generated from the second inner-component region can be efficiently radiated by the radiating member.

DETAILED DESCRIPTION

First Embodiment

Figure 1:
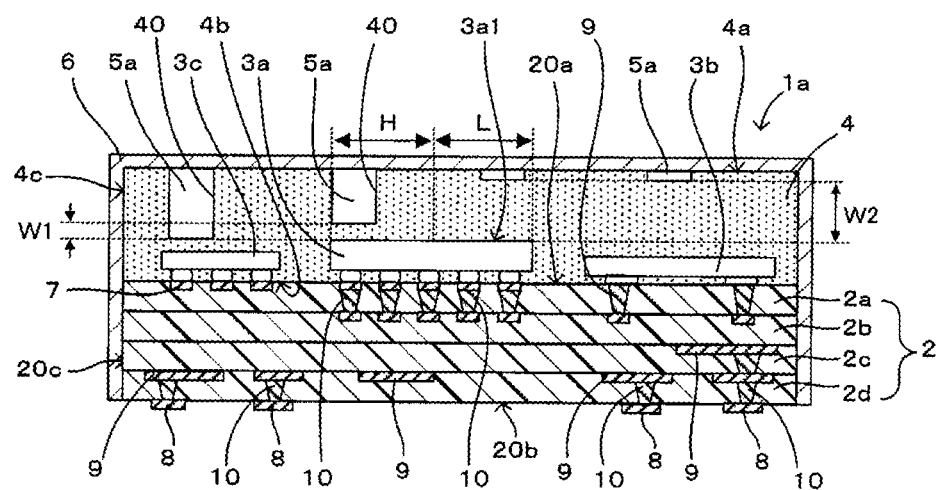
FIG. 1 is a cross-sectional view of a module according to a first embodiment of the present disclosure.
Figure 2:
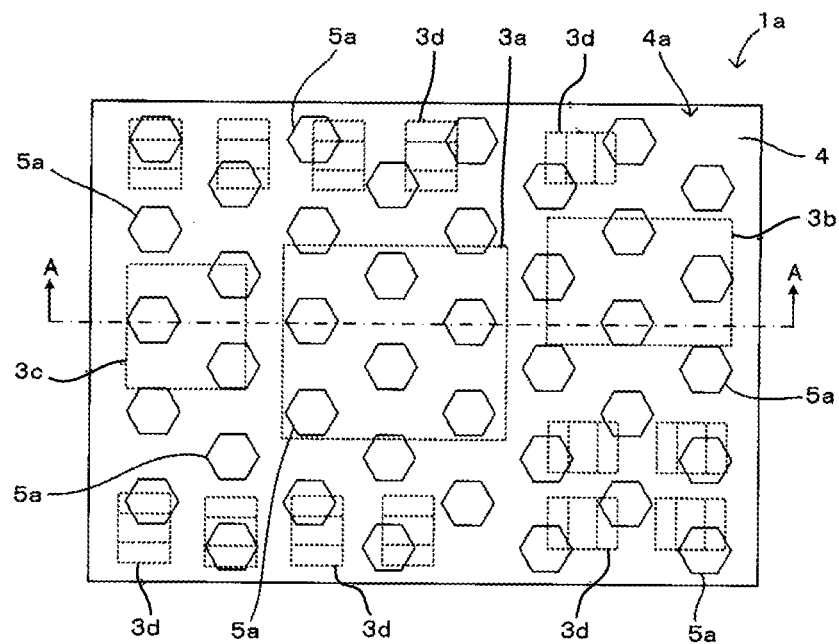
FIG. 2 is a plan view of the module illustrated in FIG. 1 in a state where a shield film is removed.
Figure 3:
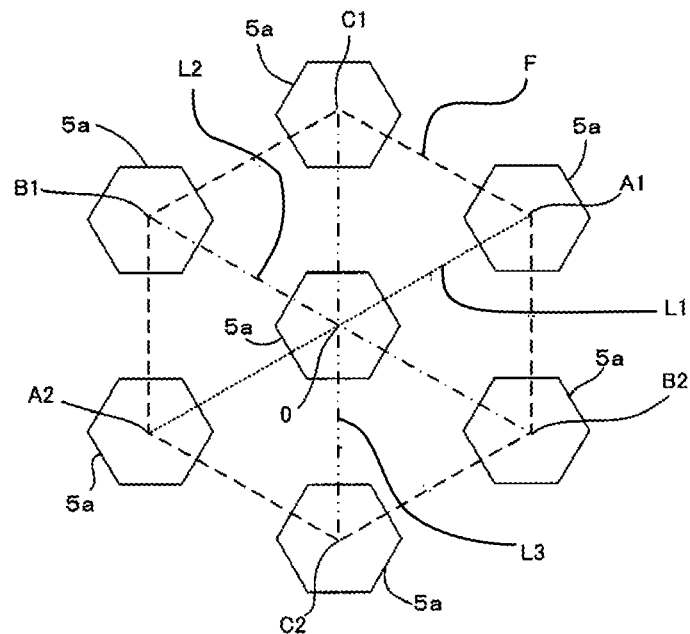
FIG. 3 is an illustration for describing arrangement of radiators illustrated in FIG. 1.

A module 1a according to a first embodiment of the present disclosure is described with reference to FIGS. 1 to 3. FIG. 1 is a cross-sectional view taken along a line A-A with arrows in FIG. 2. FIG. 2 is a plan view of the module 1a in a state where a shield film 6 is removed. FIG. 3 is an illustration for describing arrangement of radiators 5a.

As illustrated in FIGS. 1 and 2, the module 1a according to the present embodiment includes a multilayer wiring substrate 2 (corresponding to "wiring substrate" in the present disclosure), a plurality of mounting components 3a to 3d mounted on an upper surface 20a of the multilayer wiring substrate 2, a sealing resin layer 4 laminated on the upper surface 20a of the multilayer wiring substrate 2, a shield film 6 covering a surface of the sealing resin layer 4, and a plurality of radiators 5a in the sealing resin layer 4 and may be implemented on, for example, a mother substrate, or the like in electronic equipment that uses high-frequency signals.

The multilayer wiring substrate 2 may be a laminate of a plurality of insulating layers 2a to 2d made of, for example, a low-temperature co-fired ceramic material, a high-temperature co-fired ceramic material, a glass epoxy resin, or the like. Mounting electrodes 7 for use in mounting the mounting components 3a to 3d are disposed on the upper surface 20a (corresponding to "principal surface of the wiring substrate" in the present disclosure) of the multilayer wiring substrate 2. A plurality of outer electrodes 8 for external connection are disposed on a lower surface 20b of the multilayer wiring substrate 2. Various inner wiring electrodes 9 are disposed between neighboring layers of the insulating layers 2a to 2d, and a plurality of via conductors 10 for connecting the inner wiring electrodes 9 on different layers of the insulating layers 2a to 2d are disposed inside the multilayer wiring substrate 2. Each of the mounting electrodes 7, outer electrodes 8, and inner wiring electrodes 9 is made of a metal commonly used as a wiring electrode, such as copper, silver, or aluminum. The via conductors 10 are made of a metal, such as silver or copper. Nickel plating and gold plating (Ni/Au plating), nickel plating, palladium plating, and gold plating (Ni/Pd/Au plating), or nickel plating and tin plating (Ni/Sn plating) may be applied to each of the mounting electrodes 7 and the outer electrodes 8.

Each of the mounting components 3a to 3d may be a semiconductor element, such as an integrated circuit or a power amplifier, or a chip component, such as a chip inductor, a chip capacitor, and a chip resistor, and is mounted on the multilayer wiring substrate 2 by a common surface mount technique, such as soldering. In the present embodiment, among the mounting components 3a to 3d, the mounting components 3a and 3c (corresponding to "first component" or "third component" in the present disclosure) are components whose amounts of heat generated when the module 1a is energized are large, and the remaining mounting components 3b and 3d (corresponding to "second component" in the present disclosure) are components whose amounts of heat generated are smaller than those of the mounting components 3a and 3c. The mounting component 3a has a region where the amount of heat generated is large (see region H in FIG. 1) and a region where it is small (see region L in FIG. 1), as seen from a direction perpendicular to the upper surface 20a of the multilayer wiring substrate 2 (hereinafter sometimes referred to as in plan view).

The sealing resin layer 4 is made of a resin commonly used as a sealing resin, such as an epoxy resin, and seals the mounting components 3a to 3d. The sealing resin layer 4 has a lower surface 4b (corresponding to "contact surface of the sealing resin layer" in the present disclosure) in contact with the multilayer wiring substrate 2, an upper surface 4a (corresponding to "opposed surface of the sealing resin layer" in the present disclosure) opposed to the lower surface 4b, and a side surface 4c. A plurality of depressions 40 are disposed in the upper surface 4a. The radiators 5a are set in the corresponding depressions 40.

The radiators 5a may be set in the depressions 40 by, for example, forming the plurality of depressions 40 in the upper surface 4a of the sealing resin layer 4 by laser processing and then filling the plurality of depressions 40 with, for example, conductive paste or fitting a high thermal conductive material into the depressions 40 by putting metal cylinders corresponding to the shapes of the depressions 40 or by filling the depressions 40 with paste predominantly composed of a metal. That is, the conductive paste or metal cylinders are set in close contact with the depressions. As illustrated in FIG. 2, the outline of the opening of each of the depressions 40 has a regular hexagonal shape, and thus each of the radiators 5a takes a hexagonal column shape. The depressions 40 are formed such that the radiators 5a are spaced substantially uniformly. Specifically, as illustrated in FIG. 3, as seen from the direction perpendicular to the upper surface 20a of the multilayer wiring substrate 2, the radiators 5a are arranged such that when the center point 0 of one radiator 5a (reference radiator 5a) is defined as the center of a regular hexagon F, the center points A1, A2, B1, B2, C1, and C2 of other neighboring radiators 5a are positioned at the apices of this regular hexagon. In this arrangement of the radiators 5a, the radiators 5a next to the reference radiator 5a are spaced away from the reference radiator 5a by the same distance, that is, the radiators 5a are spaced uniformly.

Of the diagonal lines of the regular hexagon F, the three diagonal lines pass through the center point 0, and one of these diagonal lines is a diagonal line L1 (broken line) in which the center points A1, 0, and A2 are present. Here, one set of parallel sides of the radiator 5a having the center point A1, one set of parallel sides of the reference radiator 5a, and one set of parallel sides of the radiator 5a having the center point A2 are arranged in a direction perpendicular to the diagonal line L1, and these six sides are arranged in parallel with each other. This arrangement relation of the sides is substantially the same as that for the remaining diagonal lines, that is, the relation of the sides of the radiators 5a having the center points B1 and B2 present in the diagonal line L2 (dot-and-dash line) and the relation of the sides of the radiators 5a having the center points C1 and C2 present in the diagonal line L3 (dash-dot-dot line). In this arrangement of the radiators 5a, stresses produced by the difference in the coefficient of linear expansion between the radiators 5a and the resin of the sealing resin layer 4 easily cancel out each other among the neighboring radiators 5a. Therefore, separation at an interface between the radiators 5a and the sealing resin layer 4 and deformation of the sealing resin layer 4 caused by the difference in the coefficient of linear expansion between the radiators 5a and the resin of the sealing resin layer 4 can be suppressed.

In the present embodiment, the depth of the depression 40 in which each of the radiators 5a is set (depth in the thickness direction of the sealing resin layer 4) differs according to the location of the depression 40. For example, as illustrated in FIG. 1, as seen from the direction perpendicular to the upper surface 20a of the multilayer wiring substrate 2, the depressions 40 overlapping the mounting component 3a are formed such that a gap W1 between the bottom of a depression 40 that is included in these depressions 40 and that overlaps the region H, where the amount of heat generated is large, (corresponding to "second inner-component region" in the present disclosure) and an upper surface 3a1 of the mounting component 3a is narrower than a gap W2 between the bottom of a depression 40 that is included in these depressions 40 and that overlaps the region L, where the amount of heat generated is small, (corresponding to "first inner-component region" in the present disclosure) and the upper surface 3a1 of the mounting component 3a. That is, in the present embodiment, the depths of the depressions 40 are determined such that, as seen from the direction perpendicular to the upper surface 20a of the multilayer wiring substrate 2, the radiator 5a overlapping the region H, where the amount of heat generated is large, is near to the mounting component 3a and the radiator 5a overlapping the region L, where the amount of heat generated is small, is remote from the mounting component 3a. In both regions, the sealing resin layer is present between the bottoms of the depressions and the mounting components, and the depressions do not reach the surface of the component. Each of the radiators 5a corresponds to "radiator element" in the present disclosure, and the collection of radiators 5a, that is, the plurality of radiators 5a correspond to "radiating member" in the present disclosure.

The shield film 6 covers the surface (upper surface 4a, side surface 4c) of the sealing resin layer 4 and a side surface 20c of the multilayer wiring substrate 2. Each of the radiators 5a is connected to the shield film 6 at the upper surface 4a of the sealing resin layer 4. The shield film 6 is connected to a ground electrode (illustration is omitted) exposed to the side surface 20c of the multilayer wiring substrate 2.

The shield film 6 can be formed as a multilayer structure that includes a close contact film laminated on the upper surface 4a of the sealing resin layer 4, a conductive film laminated on the close contact film, and a protective film laminated on the conductive film (not illustrated). Here, the close contact film is constructed to enhance the adhesion between the conductive film and the sealing resin layer 4 and may be made of, for example, a metal, such as stainless steel. The conductive film is a layer substantially serving the shielding function of the shield film 6 and may be made of, for example, a metal of any one of copper, gold, and silver. The protective film is constructed to prevent the conductive film from being corroded or scratched and may be made of, for example, stainless steel.

Accordingly, in the above-described embodiment, in which the plurality of depressions 40 are disposed in the upper surface 20a of the sealing resin layer 4 and the radiators 5a are set in these depressions 40, because certain gaps W1 and W2 are kept between the bottoms of the depressions 40 and the mounting components 3a to 3d, unlike the known module, it is not necessary to arrange spacers for preventing damage to the components between the components and the radiating member at the time of forming the places for arranging the radiating member by laser processing. The mounting component 3a has the region H, where the amount of heat generated is large, and the region L, where the amount of heat generated is small, as seen from the direction perpendicular to the upper surface 20a of the multilayer wiring substrate 2, the distance between the radiator 5a arranged in the region overlapping the region H in plan view and the upper surface 3a1 of the mounting component 3a (gap W1) is shorter than the distance between the radiator 5a arranged in the region overlapping the region L and the upper surface 3a1 of the mounting component 3a (gap W2), and thus heat generated by the mounting component 3a can be efficiently radiated. As for the distance between the region L, where the amount of heat generated is small, and the radiator 5a, for example, if it is equal to the distance between the region H, where the amount of heat generated is large, and the radiator 5a (gap W1), the temperature in the region L, where the amount of heat generated is small, may also increase, and the characteristics may change or degrade. In the present embodiment, however, because the distance between the radiator 5a arranged in the region overlapping the region L in plan view and the upper surface 3a1 of the mounting component 3a (gap W2) is longer than the distance between the radiator 5a arranged in the region overlapping the region H and the upper surface 3a1 of the mounting component 3a (gap W1), the above-described changes or degradation in the characteristics can be suppressed. In the region L in the mounting component 3a, because the distance to the radiator 5a is long, the space between the upper surface 3a1 of the mounting component 3a and the radiator 5a in this region L can be used as a space for arranging other members, and thus the module 1a can have a high degree of design flexibility.

The radiators 5a are dispersed substantially uniformly as seen from the direction perpendicular to the upper surface 20a of the multilayer wiring substrate 2, regardless of whether they overlap the mounting components 3a to 3d. For example, if the radiating member is arranged in only the region overlapping each of the heat generating components (mounting components 3a, 3c) in plan view, separation caused by the difference in the coefficient of linear expansion between the radiating member and the resin of the sealing resin layer may occur between the radiating member and the sealing resin layer. Like in the present embodiment, however, when the radiating member includes the plurality of radiators 5a, the contact area between the radiating member (radiators 5a) and the sealing resin layer 4 is increased, and thus the occurrence of separation between the radiators 5a and the sealing resin layer 4 caused by the difference in the coefficient of linear expansion between them can be prevented. The dispersed arrangement of the radiators 5a can suppress deformation of the sealing resin layer 4 caused by the difference in the coefficient of linear expansion between the radiating member (radiators 5a) and the resin of the sealing resin layer 4 and separation of the sealing resin layer 4 from the multilayer wiring substrate 2 caused by, for example, a stress produced with the deformation of the sealing resin layer 4. Warpage of the multilayer wiring substrate itself can also be suppressed.

Because the radiators 5a are connected to the shield film 6, heat generated from the mounting components 3a and 3c can also be radiated through the shield film 6. Therefore, the radiation characteristics of the module 1a can be further improved.

(Variation of Arrangement of Radiators)

Figure 4:
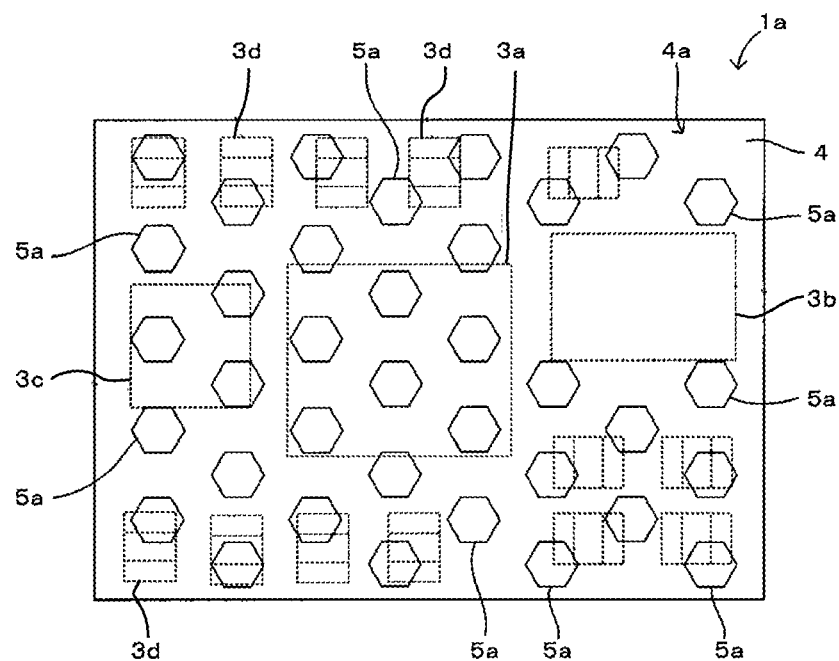
FIG. 4 illustrates a variation of the arrangement of the radiators illustrated in FIG. 1.

In the present embodiment, the radiators 5a are spaced uniformly in plan view. In an example variation thereof, as illustrated in FIG. 4, basically, the radiators 5a spaced uniformly may be arranged, but in part, the radiators 5a may not be arranged, in plan view, in a region overlapping a component that easily changes its characteristics by thermal effects or the mounting component 3b, which is one of the mounting components 3 and whose amount of heat generated is small. In this configuration, the radiating structure can have a high degree of flexibility adjusted for the amount of heat generated from each of the mounting components 3a to 3d and the size of each of the mounting components 3a to 3d. In this variation, the mounting component 3a, which is a heat generating component, corresponds to "fourth component" in the present disclosure, and the mounting component 3b, which does not easily generate heat, corresponds to "fifth component" in the present disclosure.

Second Embodiment

Figure 5:
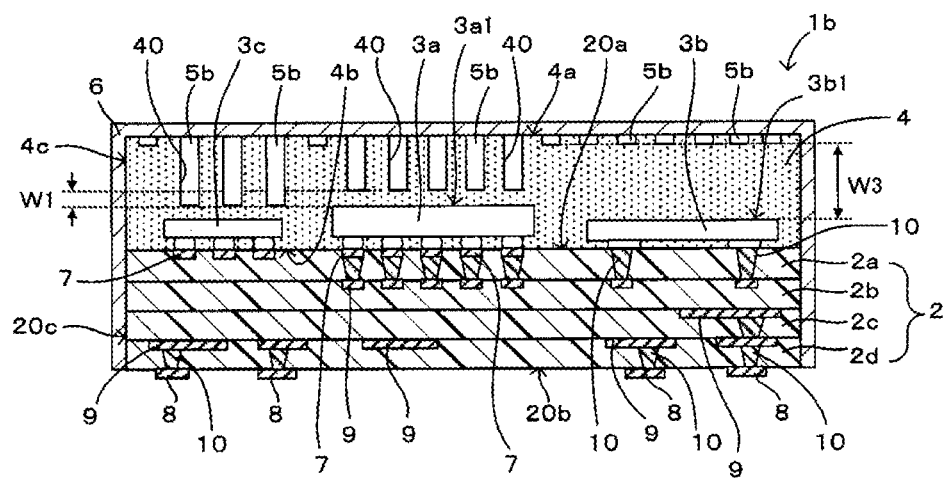
FIG. 5 is a cross-sectional view of a module according to a second embodiment of the present disclosure.
Figure 6:
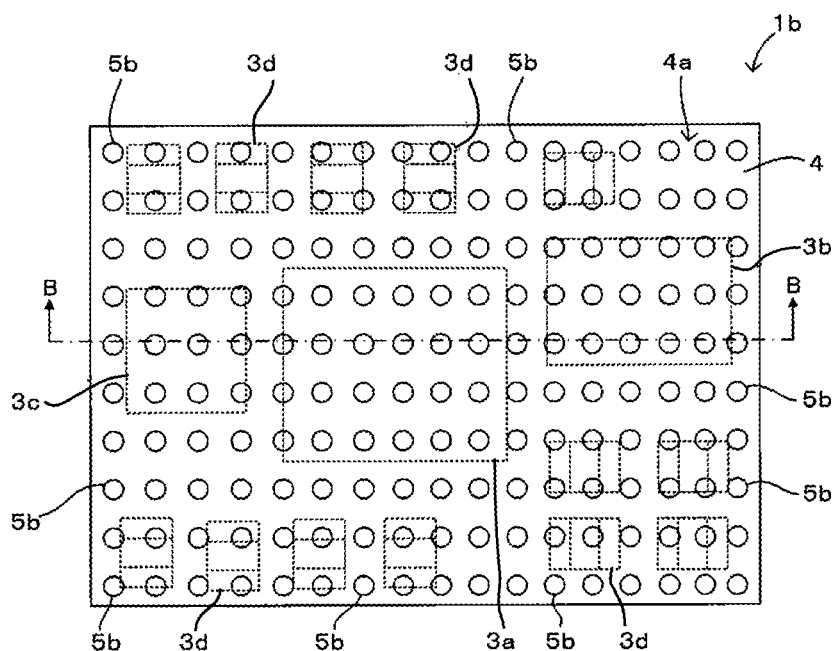
FIG. 6 is a plan view of the module illustrated in FIG. 5 in a state where a shield film is removed.

A module 1b according to a second embodiment of the present disclosure is described with reference to FIGS. 5 and 6. FIG. 5 is a cross-sectional view of the module 1b taken along a line B-B with arrows in FIG. 6. FIG. 6 is a plan view of the module 1b in a state where the shield film 6 is removed.

The module 1b according to the present embodiment differs from the module 1a of the first embodiment described with reference to FIGS. 1 to 3 in the arrangement of radiators 5b and the transverse sectional shape of each of them and in the depth of the depression 40 in which each of the radiators 5b is set, as illustrated in FIGS. 5 and 6. The other configurations are the same as those of the module 1a of the first embodiment, and the description is omitted by using the same reference numerals for them.

In this case, as illustrated in FIG. 6, each of the radiators 5b has a cylindrical shape whose shape in plan view (transverse sectional shape) is circular, and they are arranged in a matrix form (dispersedly arranged). Thus, as in the first embodiment, the radiators 5b are also arranged in a region overlapping none of the mounting components 3a to 3d in plan view. In the present embodiment, as illustrated in FIG. 5, the gaps between the bottoms of all of the depressions 40 in a region overlapping the mounting component 3a, which is a heat generating component, in plan view (corresponding to "first region" in the present disclosure) and the upper surface 3a1 of the mounting component 3a are unified into W1. The gap between the bottom of each of the depressions 40 in a region overlapping each of the mounting components 3b and 3d, which are non-heat generating components, in plan view (corresponding to "second region" in the present disclosure) and an upper surface 3b1 of the mounting component 3b (non-heat generating component) is formed as W3, which is longer than W1.

In this configuration, it is not necessary to arrange spacers for preventing damage to the components between the components and the radiating member. Heat generated from the mounting component 3a can be efficiently radiated. Changes and degradation in characteristics can also be suppressed. Because the outline of the opening of each of the depressions 40 is circular, the depression 40 can be easily formed by laser processing. In the present embodiment, as in the variation of the module 1a of the first embodiment described with reference to FIG. 4, the radiators 5b may not be arranged in the region overlapping the non-heat generating component in plan view.

(Variation of Arrangement of Radiators 5b)

Figure 7:
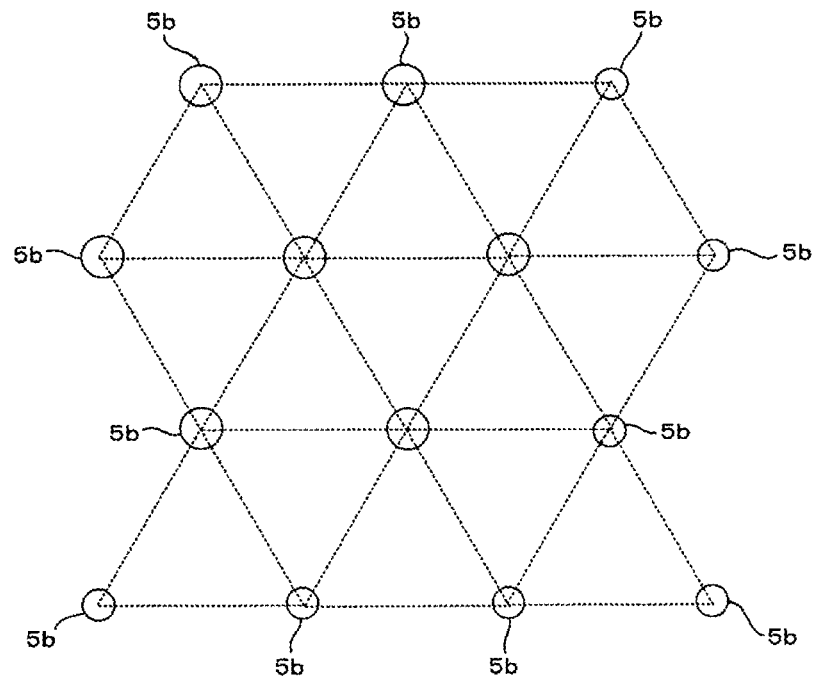
FIG. 7 illustrates a variation of arrangement of radiators illustrated in FIG. 5.

In the present embodiment, the radiators 5b are arranged in a matrix form. They may be spaced uniformly, as in the first embodiment. In this case, as illustrated in FIG. 7, as seen from the direction perpendicular to the upper surface 20a of the multilayer wiring substrate 2, when one radiator 5b is arranged such that its center is positioned at the center of a regular hexagon, other neighboring radiators 5b are arranged such that their centers are positioned at the apices of this regular hexagon. In this configuration, stresses produced by the difference in the coefficient of linear expansion between the radiators 5b and the resin of the sealing resin layer 4 easily cancel out each other among the neighboring radiators 5b, and thus separation at an interface between the radiators 5b and the sealing resin layer 4 and deformation of the sealing resin layer 4 caused by the difference in the coefficient of linear expansion between the radiators 5b and the resin of the sealing resin layer 4 can be suppressed.

Third Embodiment

Figure 8:
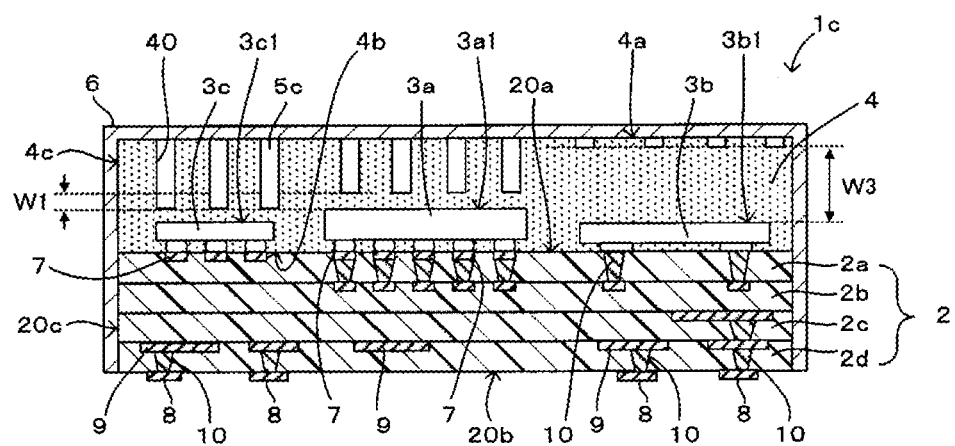
FIG. 8 is a cross-sectional view of a module according to a third embodiment of the present disclosure.
Figure 9:
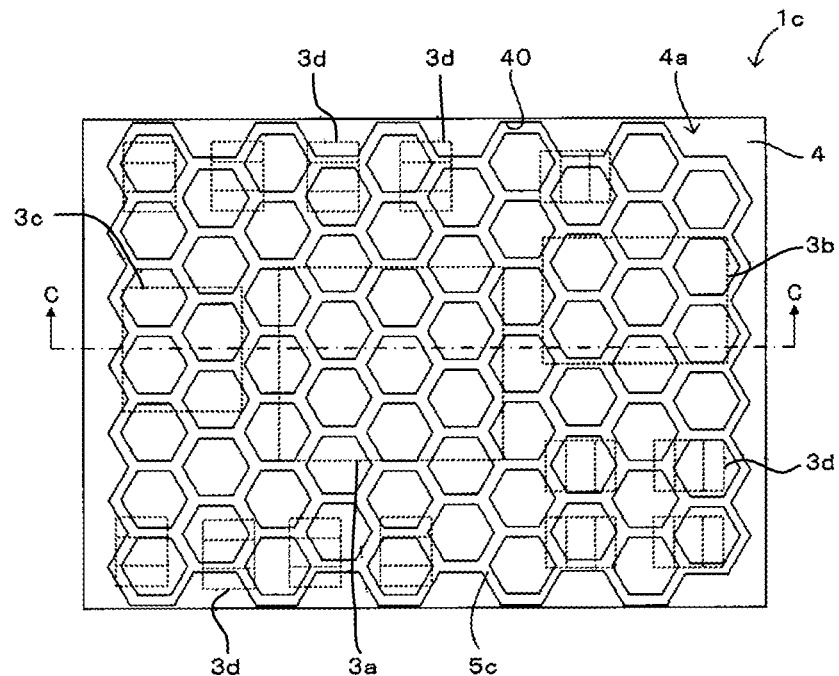
FIG. 9 is a plan view of the module illustrated in FIG. 8 in a state where a shield film is removed.
Figure 10:
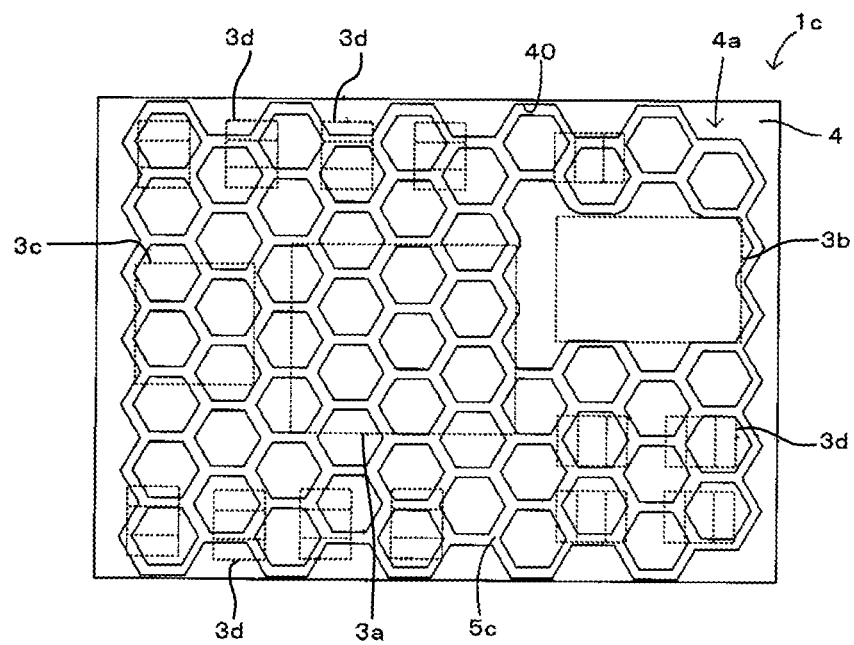
FIG. 10 illustrates a variation of a radiating member illustrated in FIG. 8.
Figure 11:
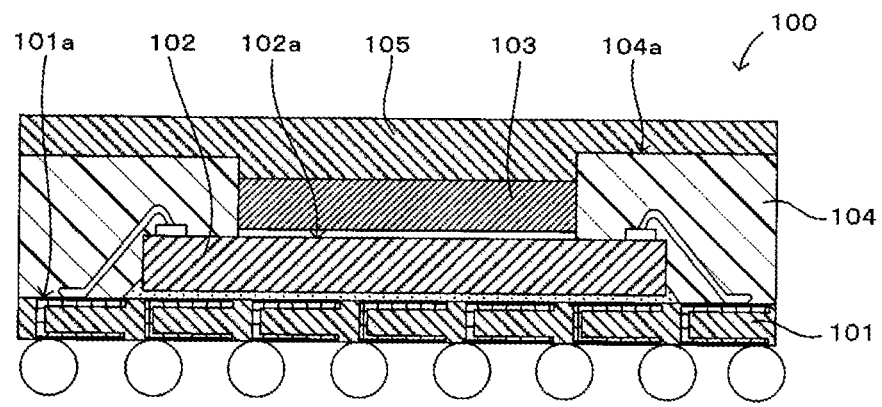
FIG. 11 is a cross-sectional view of a known module.

A module 1c according to a third embodiment of the present disclosure is described with reference to FIGS. 8 and 9. FIG. 8 is a cross-sectional view of the module 1c taken along a line C-C with arrows in FIG. 9. FIG. 9 is a plan view of the module 1c in a state where the shield film 6 is removed.

The module 1c according to the present embodiment differs from the module 1b of the second embodiment described with reference to FIGS. 5 and 6 in the shape of the depression 40 and the shape of a radiator 5c set in the depression 40, as illustrated in FIGS. 8 and 9. The other configurations are the same as those of the module 1b of the second embodiment, and the description is omitted by using the same reference numerals for them.

In this case, as seen from the direction perpendicular to the upper surface 20a of the multilayer wiring substrate 2, the depression 40 is formed in a honeycomb groove, and the radiator 5c is set in this groove. As in the second embodiment, the depression 40 is formed such that the gap W1 between the bottom of the depression 40 overlapping each of the heat generating components (mounting components 3a, 3c) in plan view and the upper surface 3a1 or 3c1 of the heat generating components (mounting components 3a, 3c) is narrower than the gap W3 between the bottom of the depression 40 overlapping the non-heat generating component (mounting component 3b) and the upper surface 3b1 of the non-heat generating component (mounting component 3b).

In this configuration, it is not necessary to arrange spacers for preventing damage to the components between the components and the radiating member. Heat generated from the mounting component 3a can be efficiently radiated. Changes and degradation in characteristics can also be suppressed. Because the radiator 5c is formed in a honeycomb pattern, separation at an interface between the radiator 5c and the sealing resin layer 4 and deformation of the sealing resin layer 4 caused by the difference in the coefficient of linear expansion between the radiator 5c and the resin of the sealing resin layer 4 can be further suppressed.

(Variation of Radiator 5c)

In the present embodiment, as in the variation of the arrangement of the radiators 5a of the first embodiment described with reference to FIG. 4, the radiator 5c may not be arranged in the region overlapping the non-heat generating component 3b, which is one of the mounting components 3 and whose amount of heat generated is small, in plan view. In this configuration, the radiating structure can have a high degree of flexibility adjusted for the amount of heat generated from each of the mounting components 3a to 3d and the size of each of the mounting components 3a to 3d.

The present disclosure is not limited to the above-described embodiments, and various changes other than the above-described ones may be made unless they depart from the spirit of the disclosure. For example, the configurations in the above-described embodiments and variations may be combined.

In the first and second embodiments described above, the transverse sectional shape of each of the radiators 5a and that of the radiators 5b are described as a regular hexagon and a circle. It may be changed to any shape, for example, a rectangle.

In the above-described embodiments, the shield film 6 is optional.

In the above-described first embodiment, the radiators 5a may not be arranged in a location overlapping the region L, where the amount of heat generated is small, in the mounting component 3a, in plan view. In this configuration, because the thermal effects of thermal conduction from the radiators 5a on the region L, where the amount of heat generated is small, can be eliminated, the radiating structure can have a high degree of flexibility adjusted for the amount of heat generated from each of the mounting components and the size of the module. The mounting component 3a in this case corresponds to "sixth component" in the present disclosure.

The present disclosure is applicable to various modules including radiating members for radiating heat generated from components mounted on wiring substrates.

REFERENCE SIGNS LIST 1a to 1c module
2 multilayer wiring substrate (wiring substrate)
3a, 3c component (first component, third component, fourth component, sixth component)
3b component (second component, fifth component)
3d component (second component)
5a, 5b radiator (radiator element)
5c radiator (radiating member)
40 depression

The invention claimed is:

1. A module comprising:
a wiring substrate;
a first component and a second component mounted on a principal surface of the wiring substrate;
a sealing resin layer having a contact surface in contact with the wiring substrate and an opposed surface opposed to the contact surface, the sealing resin layer sealing the first component and the second component;
at least two depressions at the opposed surface of the sealing resin layer; and
a radiating member set in each of the depressions, each radiating member including at least one radiator element,
wherein an amount of heat generated from the second component is smaller than an amount of heat generated from the first component,
the radiating member has a first region overlapping the first component and a second region overlapping the second component as seen from a direction perpendicular to the principal surface of the wiring substrate,
the depressions reach neither the first component nor the second component, and
a distance from a bottom of the depression in the first region to the first component is shorter than a distance from a bottom of the depression in the second region to the second component.

2. The module according to claim 1, wherein the module further comprises a plurality of depressions at the opposed surface of the sealing resin layer and a plurality of radiator members each comprising the at least one radiator element set in the plurality of depressions, and
some of the plurality of radiator elements are arranged in a region that overlaps neither the first component nor the second component as seen from the direction perpendicular to the principal surface of the wiring substrate.

3. The module according to claim 2, wherein the plurality of radiator elements are spaced uniformly as seen from the direction perpendicular to the principal surface of the wiring substrate.

4. The module according to claim 2, further comprising a shield film that covers the opposed surface of the sealing resin layer while being in contact with the radiating members.

5. The module according to claim 1, further comprising a shield film that covers the opposed surface of the sealing resin layer while being in contact with the radiating members.

6. A module comprising:
a wiring substrate;
a third component mounted on a principal surface of the wiring substrate;
a sealing resin layer having a contact surface in contact with the wiring substrate and an opposed surface opposed to the contact surface, the sealing resin layer sealing the third component;
at least two depressions at the opposed surface of the sealing resin layer; and
a radiating member set in each the depression, each of the radiating members including at least one radiator element,
wherein the third component has a first inner-component region and a second inner-component region as seen from a direction perpendicular to the principal surface of the wiring substrate, an amount of heat generated from the second inner-component region is larger than an amount of heat generated from the first inner-component region, the radiating members have a region overlapping the first inner-component region and a region overlapping the second inner-component region as seen from the direction perpendicular to the principal surface of the wiring substrate, the depressions do not reach the third component, and a distance from a bottom of the depression in the region overlapping the second inner-component region in the radiating member to the third component is shorter than a distance from a bottom of the depression in the region overlapping the first inner-component region in the radiating member to the third component.

7. The module according to claim 6, wherein the module further comprises a plurality of depressions at the opposed surface of the sealing resin layer and a plurality of radiator members each comprising the at least one radiator element set in the plurality of depressions, and some of the plurality of radiator elements are arranged in a region that does not overlap the third component as seen from the direction perpendicular to the principal surface of the wiring substrate.

8. The module according to claim 7, wherein the plurality of radiator elements are spaced uniformly as seen from the direction perpendicular to the principal surface of the wiring substrate.

9. The module according to claim 7, further comprising a shield film that covers the opposed surface of the sealing resin layer while being in contact with the radiating members.

10. The module according to claim 6, further comprising a shield film that covers the opposed surface of the sealing resin layer while being in contact with the radiating members.

11. A module comprising:
a wiring substrate;
a fourth component and a fifth component mounted on a principal surface of the wiring substrate;
a sealing resin layer having a contact surface in contact with the wiring substrate and an opposed surface opposed to the contact surface, the sealing resin layer sealing the fourth component and the fifth component;
at least two depressions at the opposed surface of the sealing resin layer; and
at least two radiating members, each set in each of the depressions, each of the radiating members including at least one radiator element,
wherein an amount of heat generated from the fifth component is smaller than an amount of heat generated from the fourth component,
the depressions do not reach the fourth component, and
the radiating members have a region overlapping the fourth component and do not have a region overlapping the fifth component as seen from a direction perpendicular to the principal surface of the wiring substrate.

12. The module according to claim 11, further comprising a shield film that covers the opposed surface of the sealing resin layer while being in contact with the radiating members.

13. A module comprising:
a wiring substrate;
a sixth component mounted on a principal surface of the wiring substrate;
a sealing resin layer having a contact surface in contact with the wiring substrate and an opposed surface opposed to the contact surface and sealing the sixth component;
at least one depression at the opposed surface of the sealing resin layer; and
a radiating member set in the depression,
wherein the sixth component has a first inner-component region and a second inner-component region whose amount of heat generated is larger than that of the first inner-component region as seen from a direction perpendicular to the principal surface of the wiring substrate,
the depression does not reach the sixth component, and
the radiating member has a region overlapping the second inner-component region and does not have a region overlapping the first inner-component region as seen from a direction perpendicular to the principal surface of the wiring substrate.

14. The module according to claim 13, further comprising a shield film that covers the opposed surface of the sealing resin layer while being in contact with the radiating members.

* * * * *